United States Patent [19]

Alpaugh et al.

[11] 4,024,305

[45] May 17, 1977

[54] METHOD FOR PRODUCING A RESIN RICH EPOXY PREPREG AND LAMINATE

[75] Inventors: Warren Alan Alpaugh, Chenango Forks; William Joseph Summa, Endwell, both of N.Y.

[73] Assignee: International Business Machines Corporation, Armonk, N.Y.

[22] Filed: June 4, 1975

[21] Appl. No.: 583,830

[52] U.S. Cl. .................. 427/381; 427/412
[51] Int. Cl.² .......................... B05D 1/38
[58] Field of Search ........... 428/273, 417; 427/381, 427/385 A, 386, 390 A, 412

[56] References Cited

UNITED STATES PATENTS

| | | | |
|---|---|---|---|
| 2,956,613 | 10/1960 | Edelman et al. | 428/273 |
| 3,523,037 | 8/1970 | Chellis | 427/386 |
| 3,698,940 | 10/1972 | Mersereau | 428/209 |
| 3,808,028 | 4/1974 | Lando | 427/54 |

*Primary Examiner*—James R. Hoffman
*Attorney, Agent, or Firm*—Gerald R. Gugger

[57] ABSTRACT

A method for producing a resin rich epoxy-glass prepreg and laminate wherein the epoxy-glass prepreg is given a first pass through an impregnation tower and impregnated with dicyandiamide cured brominated bisphenol type epoxy modified with a polyfunctional additive and advanced to 80–85% of complete cure. The prepreg is given a second pass through the tower and given a dip coating of, for example, brominated bisphenol A which is advanced to 80–85% of complete cure. The resulting prepreg serves as the outer sheet of a multi-layer printed circuit board and it has a resin rich surface necessary for chemical roughening and subsequent additive plating.

7 Claims, 1 Drawing Figure

U.S. Patent     May 17, 1977     4,024,305
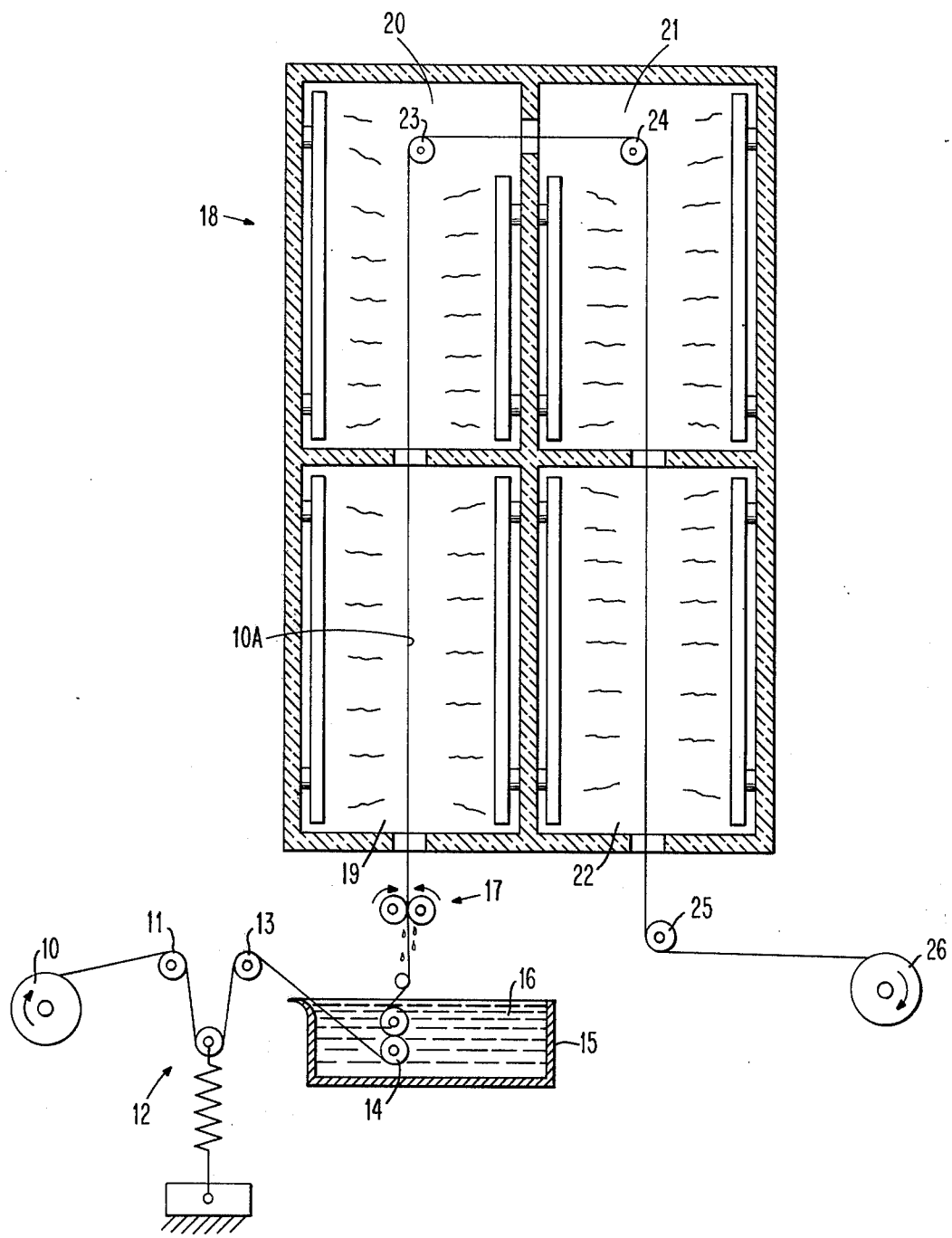

METHOD FOR PRODUCING A RESIN RICH EPOXY PREPREG AND LAMINATE

BACKGROUND OF THE INVENTION

Prepreg sheets are used in the manufacture of printed circuit boards. A prepreg sheet is a glass fabric which has been impregnated or coated with an epoxy resin and the epoxy resin advanced to the B-stage which is 30–40% of complete cure. The prepreg sheets are laminated together by heat and pressure to form the board. The inner prepreg sheets of the laminate are used for bonding purposes and to make up the desired dielectric thickness of the board. Copper plating forming the printed circuitry is applied to one or both of the outside prepreg sheets of the board.

One preferred form of applying the copper is by the well known electroless deposition process. However, prior to depositing the copper, the surface of the cured epoxy resin must be conditioned by roughening or the like so that the deposited copper pattern will adequately adhere to the resinous surface. There are several ways of conditioning the epoxy surface and one preferred method, which is fully described in U.S. Pat. No. 3,808,028, includes first exposing the cured epoxy surface to a suitable swellant of the cured epoxy. The cured surface is exposed to the swellant for a period of time sufficient to swell the epoxy surface. The swelled epoxy surface is then exposed to an etchant for the cured epoxy for a sufficient period of time to etch the swelled surface and put the surface in a condition of improved adherence for metal deposits, and the like.

In spite of the improved conditioned epoxy resin surface produced by the chemical swell and etch method, adequate adhesion of the copper plating to the resin surface still presented a problem in the manufacture of laminates for printed circuit boards. Heretofore, the standard practice of making prepreg sheets involved advancing the epoxy resin to the normal B-stage which is 30–40% of a complete cure. Upon laminating the sheets together to make a board using, for example, 500–900 p.s.i. at 350° F, the epoxy resin was unable to withstand the required lamination temperature and pressure that is needed for epoxy glass resulting in the epoxy resin flowing and squeezing out so that an insufficient amount of resin was left on the surface. When the subsequent chemical swell and etch operation was carried out, the etching would expose the glass fibers of the prepreg sheet which resulted in the formation of blisters and reduced copper adhesion. To alleviate this condition, a resin dip coating operation was introduced after the prepreg sheets were laminated together and before the swell and etch process was carried out. This step proved to be cumbersome and costly. Also, dip coating after laminating left defects, such as, unevenness and pin holes. The bottom of the coating would be heavier than the top and also de-wet areas, such as, cratering and oil spots would form. There was also tried out, an initial pass before lamination of a heavier coating of resin but this did not work out because not a sufficient amount of resin could be obtained which would level out and maintain the desired 0.001–0.002 inch thickness that was desired above the glass fibers.

Another proposed solution to the problem is described in U.S. Pat. No. 3,698,940 and involves painting a first coat of resin varnish on the glass cloth and curing it to the B-stage followed by painting a second coating of resin varnish over the first coat and curing this coat to the B-stage. This is followed by curing using a dwell lamination cycle at low pressure, the purpose of which is to flow the resin and advance it beyond the B-stage to insure that the resin will stay, and this is followed by another lamination cycle at high pressure. In this type of process, the prepreg coatings had wide tolerances which necessitated varying dwell lamination cycles. As a result, it is very difficult to control the process and maintain the resin where you want it to obtain the desired uniformity of coating. It became apparent that some other means would have to be devised to obtain the desired resin rich surface for the outer prepreg sheets of a printed circuit board.

SUMMARY OF THE INVENTION

The present invention makes it possible to obtain a prepreg sheet having a resin rich surface which is suitable for chemical roughening and subsequent additive plating. The invention involves the discovery of a novel method which comprises two passes through an impregnation tower and advancing the resin to 80–85% of complete cure.

The first pass is the typical epoxy-glass impregnation except that the resin is advanced to 80–85% of complete cure. This cure is accomplished by drying at 250° F and 325° F for 4–5 minutes.

The resin type can be one of many used throughout the industry. The preferred resin in the present invention is a dicyandiamide cured brominated bisphenol type epoxy modified with a polyfunctional additive.

In the second pass, a second coat is applied by dip coating the first pass prepreg and advancing as above to 80–85% of cure. The second coat must be a resin suitable for chemical roughening. The epoxy resins successfully used were bisphenol A type, brominated bisphenol A (modified and unmodified), and also polyester modified bisphenol A. All were dicyandiamide cured.

Catalytic additives may be added to the coating to promote electroless copper plating. The resin rich prepreg is now used as the outer sheets of a laminate and is applied in the lamination step. Measurements indicate that there is 0.001–0.002 inches of epoxy over the surface of glass fibers.

Advancing the resin material to 80–85% cure limits the flow of the outer sheets and is an important feature of the present invention. It provides a resin rich surface which will adequately support the subsequent chemical swelling and etching process and prevents the etchant from attacking and exposing the glass fibers. In addition, it eliminates the need for any dwell lamination cycle and consistant uniform coatings are obtained using only one constant lamination cycle which is easy to control.

It is, then, a primary object of the present invention to provide a novel and improved method for producing a resin rich epoxy-glass prepreg.

A further object of the present invention is to provide a novel and improved method for producing a resin rich epoxy-glass prepreg wherein the resin is advanced to 80–85% of complete cure.

A still further object of the present invention is to provide an improved resin rich epoxy-glass prepreg which can be subsequently chemically roughened and additively plated, to produce a printed circuit board.

Another object of the present invention is to provide a novel and improved method for producing a resin rich epoxy-glass prepreg which comprises a resin impregnation pass followed by a resin dip coating pass with the resin being advanced to 80–85% of complete cure during each pass.

The foregoing and other objects, features and advantages of the invention will be apparent from the following more particular description of a preferred embodiment of the invention as illustrated in the accompanying drawing.

BRIEF DESCRIPTION OF THE DRAWING

The single FIGURE of the drawing shows an apparatus for impregnating and coating a glass fabric with an epoxy resin composition and for partially curing the epoxy resin impregnated fabric in accordance with the present invention.

DESCRIPTION OF PREFERRED EMBODIMENT

Referring to the drawing, a roll of woven glass fabric 10, commonly 2 mils to 10 mils in thickness is threaded over guide roll 11, under a tension roll 12 and over a second guide roll 13. A pair of guide squeeze rolls 14 direct the web of fabric 10A into a pan 15 which contains an epoxy resin solution 16. On the first pass of the web of fabric through the apparatus the fabric is impregnated with the resin solution. The resin type can be one of many used throughout the industry. In the present invention, the preferred resin for the first pass is a dicyandiamide cured brominated bisphenol type epoxy modified with a polyfunctional additive. Two polyfunctional additives used were epoxidized novolac and tetrakis (hydroxyphenyl) ethane tetraglycidyl ether. The resin used on this first pass is preferably highly crosslinked and acts as a barrier to activation and further penetration thus preventing overactivation or fiber penetration. Dicyandiamide cured brominated bisphenol type epoxy fulfills this requirement and, in addition, has the advantage of being flame retardant. This is essential in order to meet safety requirements when the printed circuit boards are used in office products. After being impregnated, the fabric 10A passes through a pair of doctor rolls 17 where excess epoxy resin solution is removed from the surfaces of the web and dropped back into the pan. The amount of resin solution weight pickup can be varied by moving the rolls 17 toward or away from the web by a few tenths of a mil.

The web 10A then passes into an oven, generally designated as 18. The oven is comprised of four individual chambers 19, 20, 21 and 22. Each chamber is heated separately and each one contains a blower (not shown) to circulate hot air over the surfaces of the web. Chamber 19 is heated to provide a temperature of 250° F, ±5° F, so that as the web passes therethrough, solvents such as methyl ethyl ketone and methyl cellosolve are removed from the web leaving only the resinous material behind. Chambers 20, 21 and 22 are heated so that a temperature of 325° F, ±5° F, is maintained in each one. As the web passes over turn around rolls 23 and 24 and passes through these chambers 20, 21 and 22, the epoxy resin residue is polymerized to a desired state of partial cure. The web then passes out of the oven to web drive 25 and finally onto a driven variable-speed windup roll 26. Windup roll 26 allows one to control the speed and tension of the fabric going through the oven.

As was previously mentioned, a feature of the present invention is that during both the first impregnation pass and the second dip coating pass of the web through the oven the resinous material is advanced to 80–85% of complete cure which is beyond the normal B-stage of 30–40% of complete cure. As one example of accomplishing this for the impregnation pass above described, assume that the glass fabric web 10A is of the type which weighs in the order of 2.8 ounces per square yard of fabric. The web is fed through the oven at a constant rate of 10–14 feet per minute, taking from 4–5 minutes to pass through the four chambers 19–22. Solvents are removed at 250° F in chamber 19 and the resin residue polymerized at 325° F in chambers 20–22 to advance it to 80–85% of complete cure. The tension of the web is in the order of 4 pounds per inch of web. The doctor rolls 17 are rotated in a direction opposite to the direction of web travel at a rate of 5–7 feet per minute and have a roll gap of 0.009 – 0.015 inches. The resulting resin pick up weight range was 44–55 parts by weight with the impregnated fabric comprising approximately 50% fabric and 50% resin which has been impregnated on both sides of the fabric web such that it is dispersed throughout the fabric.

The resin impregnated web 10A is now given a second pass through the apparatus whereby a second resin coat is applied to both sides by dip coating. For this second pass, the doctor rolls 17 are completely open and are not rotated. Also, the resin solution 16 in pan 15 is changed to a resin which is suitable for chemical roughening. The resins successfully used were bisphenol A type, brominated bisphenol A (modified and unmodified) and also polyester modified bisphenol A. All were dicyandiamide cured. Using brominated bisphenol A, for example, the web, under 4 pounds per inch tension, was fed through the apparatus again at a rate of 10–14 feet per minute and the resin dip coating on each side dried for 4–5 minutes by solvent removal at 250° F and polymerization at 325° F to advance it to 80–85% of complete cure. After the dip coat pass the pick up resin weight range was 70–80 parts by weight with the final prepreg comprising 70–80% of resin and 20–30% of fabric.

The 70–80% resin results in a resin rich prepreg whichis now ready for use as the outer sheets of a laminate or multi-layer printed circuit board with said outer sheets having in the order of 0.001 – 0.002 inches of epxoy resin over the surface of the glass fibers of the fabric. With the resinous material having been advanced to 80–85% of complete cure, it has the desired polymerization whereby it can withstand the single constant lamination cycle carried out at 500–900 p.s.i. at 350° F and has just enough flow to level out which is important in the manufacture of precise and uniform printed circuit boards. It was found that less than 80–85% of cure resulted in an undercure and too much flow of resin and more than 80–85% of cure resulted in an overcure and insufficient leveling out of the resin. Also, as was pointed out, the present improved prepreg retains a sufficient resin rich surface after lamination to protect the glass fibers from being exposed by the subsequent chemical swelling and etching process thereby leaving a surface which will have a good adhesive quality for receiving electroless deposition of copper.

Another feature of the present method is that of obtaining a prepreg having the desired 79–80% of resin. It was found that this could not be satisfactorily obtained by applying a heavier resin coating in one pass of the web. There was too much resin to control and bubble entrapment occurred.

Although in the embodiment described, the web is dip coated on both sides it will be understood that, if desired, a scraper blade could be used to remove the coating from one side prior to drying. The reason for normally coating both sides of the prepreg is that one side is used to receive the copper plating and the other side is used to prevent curling or shrinkage. Also, it makes the following laminating step easier to carry out since it is not necessary to select one side of the sheet. If desired, for bonding purposes, one side of the sheet may be given the resin coating and the other side a coating of adhesive.

While the invention has been particularly shown and described with reference to a preferred embodiment thereof, it will be understood by those skilled in the art that various changes in form and details may be made therein without departing from the spirit and scope of the invention.

What is claimed is:

1. A method for making a resin rich epoxy prepreg suitable for subsequent chemical roughening and additive plating which comprises:
   impregnating a glass fabric with a first resin of a dicyandiamide cured brominated bisphenol type epoxy modified with a polyfunctional epoxidized novolac;
   curing said first resin impregnation to 80–85% of complete cure;
   coating the impregnated fabric with a second dicyandiamide cured epoxy resin selected from the group of epoxy resins consisting of (1) bisphenol A type, (2) brominated bisphenol A and (3) polyester modified bisphenol A; and
   curing said coating of second resin to 80–85% of complete cure.

2. A method for making a resin rich epoxy prepreg suitable for subsequent chemical roughening and additive plating which comprises:
   impregnating a glass fabric with a first resin of a dicyandiamide cured brominated bisphenol type epoxy modified with a polyfunctional epoxidized novolac;
   curing said first resin impregnation to 80–85% of complete cure;
   coating the impregnated fabric with a second dicyandiamide cured epoxy resin selected from the group of epoxy resins consisting of (1) bisphenol A type, (2) brominated bisphenol A and (3) polyester modified bisphenol A; and
   curing said coating of second resin to 80–85% of complete cure to provide a resin rich prepreg having 70–80% resin and 20–30% glass fabric.

3. A method for making a resin rich epoxy prepreg suitable for subsequent chemical roughening and additive plating which comprises:
   impregnating a glass fabric with a first resin of a dicyandiamide cured brominated bisphenol type epoxy modified with a polyfunctional epoxidized novolac;
   curing said first resin impregnation to 80–85% of complete cure by drying in a temperature range of 250° F – 325° F for 4–5 minutes;
   coating the impregnated fabric with a second resin of a dicyandiamide cured brominated bisphenol A type; and curing said coating of second resin to 80–85% of complete cure by drying in a temperature range of 250° F – 325° F for 4–5 minutes.

4. The method as defined in claim 3 wherein said second resin is a dicyandiamide cured bisphenol A type.

5. The method as defined in claim 3 wherein said second resin is a dicyandiamide cured polyester modified bisphenol A type.

6. A method for making a resin rich epoxy prepreg suitable for subsequent chemical roughening and additive plating which comprises:
   impregnating a glass fabric with a first resin of a dicyandiamide cured brominated bisphenol type epoxy modified with an epoxidized novolac;
   curing said first resin impregnation to 80–85% of complete cure for 4–5 minutes by solvent removal at a temperature range of 245° F – 255° F and polymerization at a temperature range of 320° F – 330° F;
   coating the impregnated fabric with a second dicyandiamide cured epoxy resin selected from the group of epoxy resins consisting of (1) bisphenol A type, (2) brominated bisphenol A and (3) polyester modified bisphenol A; and
   curing said coating of second resin to 80–85% of complete cure for 4–5 minutes by solvent removal at a temperature range of 245° F – 255° F and polymerization at a temperature range of 320° F – 330° F.

7. A method for making a resin rich epoxy prepreg suitable for subsequent chemical roughening and additive plating which comprises:
   impregnating a glass fabric with a first resin of a dicyandiamide cured brominated bisphenol type epoxy modified with a polyfunctional tetrakis (hydroxyphenyl) ethane tetraglycidyl ether;
   curing said first resin impregnation to 80–85% of complete cure;
   coating the impregnated fabric with a second dicyandiamide cured epoxy resin selected from the group of epoxy resins consisting of (1) bisphenol A type, (2) brominated bisphenol A and (3) polyester modified bisphenol A; and
   curing said coating of second resin to 80–85% of complete cure.

* * * * *